(12) United States Patent
Tramper et al.

(10) Patent No.: US 8,629,777 B2
(45) Date of Patent: Jan. 14, 2014

(54) SYSTEM AND METHOD FOR MAGNETOMETER INSTALLATION

(75) Inventors: William D. Tramper, Rockford, MI (US); Andrew L. DeRosia, Kentwood, MI (US)

(73) Assignee: L-3 Communications Avionics Systems, Inc., Grand Rapids, MI (US)

( * ) Notice: Subject to any disclaimer, the term of this patent is extended or adjusted under 35 U.S.C. 154(b) by 262 days.

(21) Appl. No.: 13/081,770

(22) Filed: Apr. 7, 2011

(65) Prior Publication Data

US 2011/0248854 A1 Oct. 13, 2011

Related U.S. Application Data

(60) Provisional application No. 61/321,754, filed on Apr. 7, 2010.

(51) Int. Cl.
*G08B 17/12* (2006.01)
*G01C 19/00* (2013.01)

(52) U.S. Cl.
USPC .......................................... 340/600; 702/104

(58) Field of Classification Search
USPC ............. 340/600; 33/356, 357, 361; 702/104, 702/151
See application file for complete search history.

(56) References Cited

U.S. PATENT DOCUMENTS

| | | | |
|---|---|---|---|
| 3,530,375 A * | 9/1970 | Passier | 324/331 |
| 3,683,668 A | 8/1972 | Baker et al. | |
| 4,733,179 A * | 3/1988 | Bauer et al. | 324/244 |
| 4,852,012 A * | 7/1989 | Suyama | 701/408 |
| 5,065,521 A | 11/1991 | Waldrop et al. | |
| 5,245,909 A | 9/1993 | Corrigan et al. | |
| 5,455,442 A * | 10/1995 | Neilson et al. | 257/124 |
| 5,654,635 A | 8/1997 | Assous et al. | |
| 5,737,226 A * | 4/1998 | Olson et al. | 701/530 |
| 7,146,740 B2 | 12/2006 | Manfred | |
| 7,223,063 B2 | 5/2007 | Jonas | |
| 7,446,661 B2 * | 11/2008 | Bhogal et al. | 340/572.1 |
| 7,989,333 B2 * | 8/2011 | Park et al. | 438/595 |
| 8,242,423 B2 * | 8/2012 | Geswender et al. | 244/3.2 |
| 8,378,671 B1 * | 2/2013 | Mahoney | 324/248 |
| 2005/0138825 A1 * | 6/2005 | Manfred | 33/356 |
| 2005/0138852 A1 * | 6/2005 | Yamauchi | 40/582 |
| 2006/0224321 A1 | 10/2006 | Lund et al. | |
| 2009/0302836 A1 * | 12/2009 | De Smet | 324/242 |
| 2010/0010695 A1 | 1/2010 | Oomkes | |

OTHER PUBLICATIONS

International Preliminary Report on Patentability from corresponding Patent Cooperation Treaty Patent Application No. PCT/US2011/031527 mailed Oct. 18, 2012.
International Search Report (Form PCT/ISA/210) and Written Opinion of the International Searching Authority (Form PCT/ISA/237) from corresponding Patent Cooperation Treaty Application No. PCT/US11/31527, mailed Jun. 27, 2011.

* cited by examiner

*Primary Examiner* — Benjamin C Lee
*Assistant Examiner* — Sigmund Tang
(74) *Attorney, Agent, or Firm* — Gardner, Linn, Burkhart & Flory, LLP

(57) ABSTRACT

A method and system for determining the suitability of a particular location on a mobile craft for mounting a magnetometer includes positioning a magnetometer in a particular location. The magnetometer including at least one output indicating magnetic measurements made by the magnetometer. A computer is connected to the magnetometer and programmed to monitor the output(s) of the magnetometer. An attempt is made to detect magnetic interference at the mobile craft and a human-perceptible indication is provided if the output(s) of said magnetometer changes by more than a specified amount while attempting to detect magnetic interference.

23 Claims, 3 Drawing Sheets

SYSTEM AND METHOD FOR MAGNETOMETER INSTALLATION

CROSS-REFERENCE TO RELATED APPLICATION

This application claims priority from U.S. provisional patent application Ser. No. 61/321,754, filed on Apr. 7, 2010, the disclosure of which is hereby incorporated herein by reference in its entirety.

BACKGROUND OF THE INVENTION

The present invention relates to a system and method for installing one or more magnetometers on a mobile craft, such as, but not limited to, an aircraft.

When installing a magnetometer in an airplane, it is important that the installer chooses a location in the airplane that is substantially free of magnetic interference, whether from ferrous materials, high-current cables, or any current-carrying wires that are unshielded. Locations, such as baggage compartment areas, avionics bays, wings, and near landing gears are often avoided. In many cases, however, it is difficult to know the extent of any interfering extraneous magnetic fields for a particular location on the aircraft.

SUMMARY OF THE INVENTION

According to one aspect, a system and method are provided for assisting in the determination of a suitable location in or on a mobile craft for mounting one or more magnetometers. In one aspect, the system facilitates determining whether or not electrical or other powered subsystems onboard the aircraft will unduly interfere with the operation of the magnetometer. In another aspect, the system facilitates location of any ferrous material or magnetic interference that is present in an area of the craft.

A method and system for determining the suitability of a particular location on a mobile craft for mounting a magnetometer, according to an aspect of the invention, includes positioning a magnetometer in a particular location. The magnetometer includes at least one output indicating magnetic measurements made by the magnetometer. A computer is connected to the magnetometer and programmed to monitor the output(s) of the magnetometer. An attempt is made to detect magnetic interference at the mobile craft and a human perceptible indication is provided if the output(s) of said magnetometer changes by more than a specified amount while attempting to detect magnetic interference.

The attempt to detect magnetic interference may include operating at least one powered component of the mobile craft while the computer monitors the output(s) of the magnetometer and while the craft remains substantially stationary. The computer may monitor the output(s) by calculating a heading corresponding to the magnetic measurements made by the magnetometer and provide the human perceptible indication if the heading changes by more than a particular amount. A plurality of powered components of the mobile craft may be operated while the computer monitors the output(s) and while the craft remains stationary and provide the human perceptible indication if the output(s) of the magnetometer changes by more than the specified amount while any of the multiple powered components are operated.

The attempting to detect magnetic interference may include moving the magnetometer around to a plurality of different locations while the computer monitors the output(s) while the craft remains substantially stationary. The computer may monitor the output(s) by measuring field strength. The computer may compare the measured field strength with a baseline field strength measured prior to moving the magnetometer.

The human perceptible indication may be a visual indication and/or an audio indication. The mobile craft may be an airplane. The method may be performed as part of an aftermarket installation.

According to another aspect, a method for determining the suitability of a particular location on a mobile craft for mounting a magnetometer is provided. A magnetometer is mounted in a particular location and a computer is connected to the magnetometer. At least one powered component of the mobile craft is operated while the aircraft remains stationary, and a human perceptible indication is provided if the output of the magnetometer changes by more than a specified amount during the operation of the powered component. The human perceptible indication may be a visual indication and/or an audio indication.

According to another embodiment, a system is provided for determining the suitability of a particular location on a mobile craft for mounting a magnetometer. The system includes a magnetometer and a computer. The magnetometer is mounted in the particular location and includes at least one output indicating magnetic measurements made by the magnetometer. The computer communicates with the magnetometer and displays a heading based upon said magnetic measurements made by said magnetometer. The computer further monitors changes in the heading while at least one powered component of the mobile craft is operated and provides a human-perceptible indication if the heading changes by more than a specified amount while the powered component is operated.

The powered component may be the engine of the aircraft, an electrically operated subsystem or component, or any other part of the aircraft that may cause magnetic interference when operated. By having a computer automatically monitor the output of the magnetometer while one or more powered components of the aircraft are operated, any undue changes to the magnetometer heading may automatically be detected without requiring a technician or other person to physically monitor the magnetometer output as those powered components are operated. Thus, the method and system facilitate determining whether any onboard powered components of the aircraft will unduly interfere with the operation of the magnetometer. In at least one aspect, the specified amount may be chosen by a technician or other personnel and entered into the computer. In this manner, the tolerance level of an acceptable amount of magnetic interference may be chosen.

These and other objects, advantages and features of the invention will be apparent upon review of the following specification in conjunction with the drawings.

DESCRIPTION OF THE EMBODIMENTS

Figure 1:
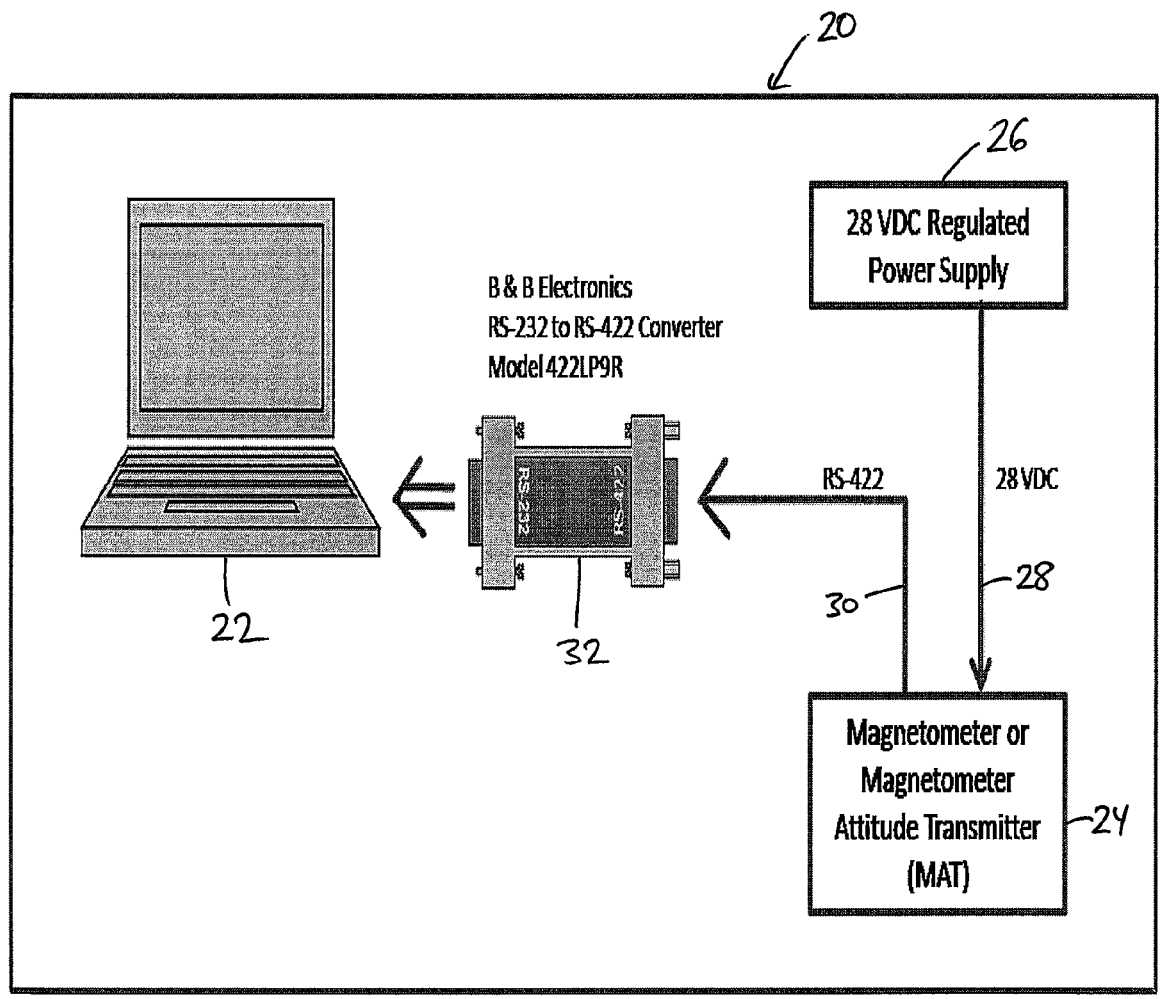
FIG. 1 is a diagram of a system for assessing the appropriateness of a magnetometer mounting location according to one embodiment.

Referring now to the drawings and the illustrative embodiments depicted therein, a magnetometer assessment system 20 according to one embodiment is shown in diagram form in FIG. 1. The magnetometer assessment system includes a computer 22, a magnetometer 24, a power supply 26, a power cable 28, at least one data cable 30, and an optional converter 32. System 20 operates after magnetometer 24 has been installed into an intended location on a mobile craft. While system 20 has applicability to multiple different types of mobile crafts in which a magnetometer may be mounted, it will be assumed for purposes of the following discussion that the mobile craft is an aircraft. This assumption, however, should not be interpreted to limit the applicability of system 20 to other types of mobile crafts.

System 20 is especially adapted to determine the suitability of mounting magnetometer 24 in a particular location of an aircraft as part of an aftermarket installation of the magnetometer 24. That is, system 20 is especially suited for use in installing aftermarket magnetometers on aircraft, although it will be understood that is has applicability to the installation of original magnetometer equipment on aircraft.

As shown in FIG. 1, magnetometer 24 is mounted to an aircraft (not shown) at its intended location. Magnetometer 24 receives its electrical power from power source 26 via power cable 28. Power source 26 may be an externally supplied power source independent from the aircraft, or it may be the power source onboard the aircraft that will supply power during normal flight conditions. Cable 28 may be a cable that is part of the aircraft or it may be a cable supplied separately from the aircraft. If part of the aircraft, cable 28 may also house one or more wires for transferring data between magnetometer 24 and the onboard cockpit avionics displays.

Cable 30 connects to at least one output of magnetometer 24. This output transmits data generated as a result of magnetometer 24's normal sensing of magnetic fields. This output data may be a calculation of heading or it may include raw magnetic field information from which heading may be calculated by one or more other components. Regardless of the precise format and substance of the data output by magnetometer 24, the data that travels over cable 30 is the same data that would normally be sent by magnetometer 24 to the cockpit avionics during normal operation of the airplane. Thus, cable 30 delivers to computer 22 the data that is normally output by magnetometer 22.

In the embodiment depicted in FIG. 1, converter 32 is shown for converting the RS-422 output of magnetometer 24 to an RS-232 output that may be read by computer 22. Converter 32 is an optional component that may be omitted if the data output by magnetometer 24 is done via a physical connection that computer 22 may directly read.

Figure 2:
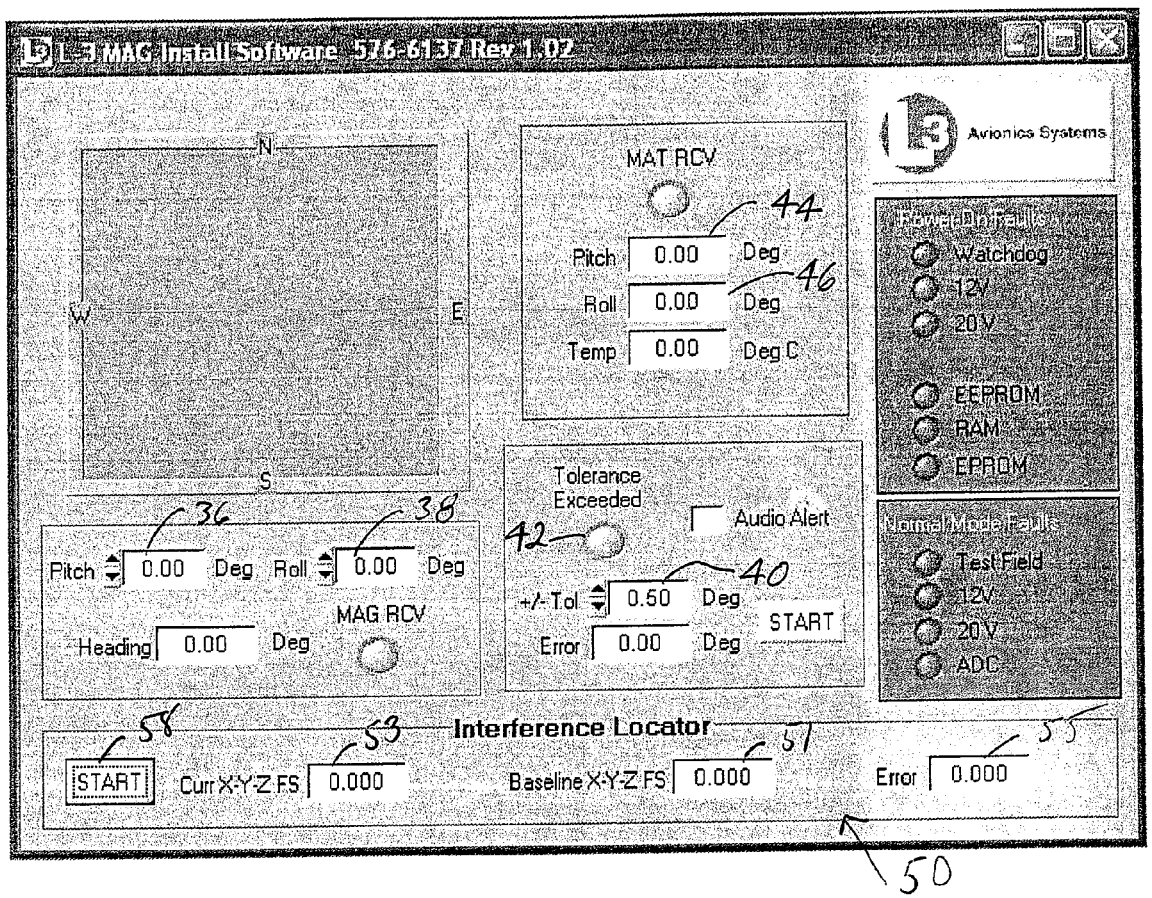
FIG. 2 is an illustrative screen shot of the computer of FIG. 1 that may be displayed during the assessment process.

Regardless of the physical hardware connecting magnetometer 24 to computer 22, computer 22 is programmed to read the data output by magnetometer 24 and display the heading that is currently being measured by magnetometer 24. One example of a screen shot that may be displayed on the screen of computer 22 is shown in FIG. 2. FIG. 2 shows a heading field 34 that indicates the heading as measured by magnetometer 24. Computer 22 is programmed to monitor this heading while various powered components of the aircraft are operated. If the heading changes while these one or more powered components are operated, then it is an indication that those one or more powered components are causing magnetic interference with magnetometer 24, and thus interfering with its proper measurement of heading. Computer 22 is further programmed to monitor the heading displayed in field 34 and determine whether or not any changes in the heading exceed a specified level. This specified level is referred to as a "tolerance" in the screen shot of FIG. 2. More specifically, this tolerance is indicated in field 40. Thus, in the example of FIG. 2, computer 22 will monitor for heading changes that exceed 0.50 degrees. If any such heading changes are detected, computer 22 is programmed to change the color of an indicator 42 displayed on the screen of computer 22. If an audio alert box 48 is selected, an audio tone will also sound to indicate a heading change that exceeds the selected tolerance.

Figure 3:
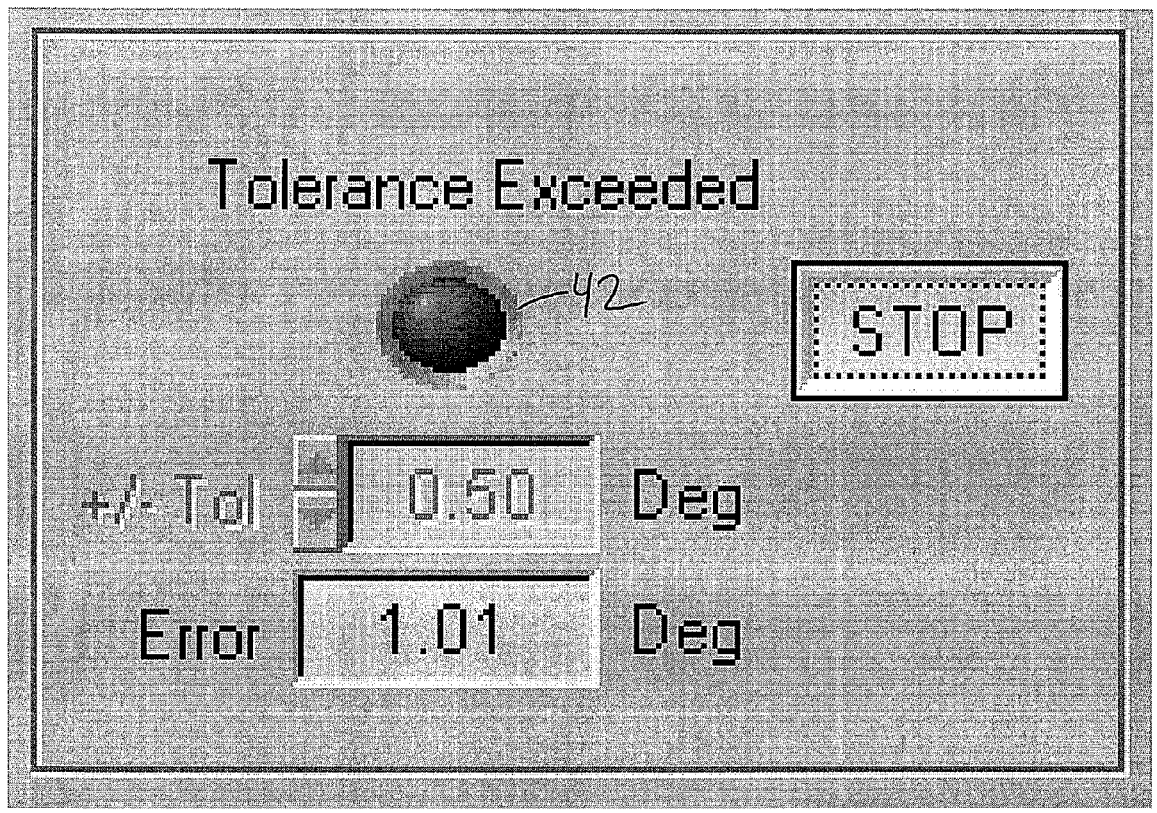
FIG. 3 is an illustrative example of a human-perceptible indication or alarm that may be provided on the computer display in response to the magnetometer heading changing by an amount greater than the specified tolerance.

FIG. 3 provides an illustrative example of the manner in which indicator 42 may be altered when a heading change is detected that exceeds the specified tolerance level. In the example of FIG. 3, indicator 42 has changed color. The specified color change may be from green to red, or from any other color to any other color. Any other suitable human-perceptible indication may be provided by computer 22, including, but not limited to, aural indications, flashing lights, transmitted messages to other electronic devices, or any other means for alerting a human that a heading change has occurred.

Indicator 42 tells a technician that one or more powered components of the aircraft are interfering with magnetometer 24's heading determining function to an extent greater than the specified tolerance level. Thus, if indicator 42 is activated after a technician has operated one or more powered components of the aircraft, the technician should consider installing the magnetometer in a different location on the aircraft that is subject to less magnetic interference.

The automatic monitoring of magnetometer 24's heading by computer 20 is carried out while the aircraft remains stationary and the various powered components of the aircraft operated. Because the aircraft is stationary, the heading output by magnetometer 24 should not change, assuming the powered components do not interfere with magnetometer 24's operation. Therefore, if computer 22 detects a heading change of an amount greater than the specified tolerance, it can be safely assumed that the heading change was caused by magnetic interference generated by the operation of the one or more powered components of the aircraft. As a result of such a detection, a technician may wish to consider mounting the magnetometer in a different location.

The screen shot of FIG. 2 also shows a pitch field 36 and a roll field 38. The numbers in these fields indicate the pitch and roll measurements of the magnetometer 24 when mounted in the aircraft. These angles may be measured manually using a digital level, or the like, or they may be measured using a magnetometer attitude transmitting device (MAT), which is not shown. The use of the MAT is optional. If used, MAT is mounted in the aircraft in the same intended location as that of the magnetometer. The MAT is mounted therein prior to the magnetometer being mounted. The MAT has the same physical size and shape as magnetometer 24 and, therefore, will fit in whatever location the magnetometer is intended for. Once mounted, the MAT will measure its roll and pitch angles and will automatically communicate them to computer 22 (via cable 30, or any other suitable connection). Thereafter, the MAT is removed from the aircraft and magnetometer 24 is mounted therein. The roll and pitch values that were previously measured by the MAT are stored by computer 22 and may be displayed in fields 44 and 46. The technician may then enter these values into fields 36 and 38. These values are used to compensate for the installation orientation of the magnetometer so that it accurately measures heading.

The tolerance level indicated in field 40 may be entered manually by a technician using a keyboard, mouse, or other input device connected to computer 22.

An additional function to determining the suitability of a particular location on a mobile craft for mounting a magnetometer includes an interference locator 50. Interference locator 50 helps the technician to determine if ferrous material or other static source of magnetic interference is present in a potential area for mounting magnetometer 24. Interference locator 50 includes a baseline field strength indicator 51 that indicates field strength in three axis (X, Y, and Z) in milligauss produced by magnetometer 24 at the beginning of a test sequence when the technician actuates a start button 58. Interference locator 50 includes a current field strength indicator 53 that indicates field strength, but during a test period when the technician moves magnetometer 24 around the area of the craft where magnetometer 24 may be positioned. If there is no ferrous material or other static source of magnetic interference, then the current field strength displayed at 53 should match the baseline field strength displayed at 51. An error indicator 55, which indicates the difference between the current and baseline field strengths, will indicate an error of close to zero. If an increase in magnetic field strength is detected by magnetometer 24, then the current field strength displayed at 53 increases and the error value indicated by error indicator 55 also increases. This may also be accompanied by an audio tone that changes in frequency as a function of the error. Thus, the audio tone will increase in frequency for greater magnetic interference sensed and decrease in frequency for a decreasing magnetic interference.

For example, a fastener in the craft that is tested by magnetic resonant testing and not properly de-gaussed may have a significant residual magnetism that could affect the accuracy of the heading if magnetometer 24 were to be mounted near the fastener. By using interference locator 50, the technician would be notified of the presence and location of this residual magnetism. In a similar fashion ferrous material may create distortions in the magnetic field which would be detected by interference locator 50. Interference locator 50 can be used both for new magnetometer installation as well as troubleshooting heading discrepancies with existing magnetometer installations.

Additional changes and modifications in the specifically described embodiments may be carried out without departing from the principles of the present invention, which is intended to be limited only by the scope of appended claims, as interpreted according to the principles of patent law, including the doctrine of equivalents.

The embodiments of the invention in which an exclusive property or privilege is claimed are defined as follows:

1. A method of installing an aftermarket magnetometer at a mobile craft, said method comprising:
   determining that a particular location on a mobile craft is substantially free of magnetic interference generated by the craft that would unduly interfere with operation of the aftermarket magnetometer;
   said determining including positioning a test magnetometer at a particular location of the mobile craft and sensing a magnetic field with said test magnetometer, said test magnetometer including at least one output indicating magnetic measurements made by said test magnetometer;
   connecting a computer to said test magnetometer, said computer programmed to monitor said at least one output;
   attempting to detect magnetic interference at the mobile craft with said test magnetometer while said craft remains substantially stationary; and
   providing a human perceptible indication if said at least one output of said test magnetometer changes by more than a specified amount.

2. The method of claim 1 wherein said attempting to detect magnetic interference includes operating at least one powered component of the mobile craft while said computer monitors said at least one output.

3. The method of claim 2 wherein said computer monitors said at least one output by calculating a heading corresponding to said magnetic measurements made by said test magnetometer and provides the human-perceptible indication if the heading changes by more than a particular amount.

4. The method of claim 2 including operating a plurality of powered components of the mobile craft while said computer monitors said at least one output; and
   providing the human-perceptible indication if said at least one output of said test magnetometer changes by more than the specified amount while any of said multiple powered components are operated.

5. The method of claim 1 wherein said attempting to detect magnetic interference includes moving said test magnetometer around to a plurality of different locations while said computer monitors said at least one.

6. The method of claim 5 wherein said computer monitors said at least one output by measuring field strength.

7. The method of claim 6 wherein said computer compares the measured field strength with a baseline field strength measured by said test magnetometer prior to said moving.

8. The method of claim 1 wherein said human-perceptible indication comprises at least one chosen from a visual indication and an audio indication.

9. The method of claim 1 wherein said mobile craft is an airplane.

10. A method of installing an aftermarket magnetometer at a mobile craft, said method comprising:
    determining that a particular location on a mobile craft is substantially free of magnetic interference generated by the craft that would unduly interfere with the operation of the aftermarket magnetometer;
    said determining including mounting a test magnetometer at the particular location of the mobile craft and sensing a magnetic field with said test magnetometer, said test magnetometer including at least one output indicating magnetic measurements made by said magnetometer;
    connecting a computer to said test magnetometer, said computer programmed to monitor said at least one output and calculate a heading corresponding to said magnetic measurements made by said test magnetometer;
    operating at least one powered component of the mobile craft while said computer monitors said at least one output and while said craft remains substantially stationary; and
    providing a human-perceptible indication if said at least one output of said test magnetometer changes by more than a specified amount while said powered component is operated.

11. The method of claim 10 further including:
    inputting said specified amount into said computer.

12. The method of claim 10 further including:
    operating a plurality of powered components of the mobile craft while said computer monitors said at least one output; and
    providing the human-perceptible indication if said at least one output of said magnetometer changes by more than the specified amount while any of said multiple powered components are operated.

13. The method of claim 12 wherein said human perceptible indication comprises at least one chosen from a visual indication and an audio indication.

14. The method of claim 10 wherein said mobile craft is an airplane.

15. An installation system for determining the suitability of a particular location on a mobile craft for mounting an aftermarket magnetometer, said system comprising:
  a test magnetometer adapted to be positioned at the mobile craft, said test magnetometer including at least one output indicating magnetic measurements made by said magnetometer;
  a computer in communication with said test magnetometer, said computer programmed to monitor said at least one output and to determine that said at least one output has varied by more than a specified amount; and
  an indicator that is adapted to provide a human-perceptible indication if said output changes by more than a specified amount while attempting to detect magnetic interference, said indicator comprising at least one chosen from a visual display and an audio indicator.

16. The system of claim 15 wherein said computer is programmed to monitor said at least one output by calculating a heading corresponding to said magnetic measurements made by said magnetometer and provides the human-perceptible indication if the heading changes by more than a particular amount.

17. The system of claim 15 wherein said computer is programmed to monitor said at least one output by measuring field strength.

18. The system of claim 17 wherein said computer is programmed to compare the measured field strength with a baseline field strength measured prior to said moving.

19. An installation system for determining the suitability of a particular location on a mobile craft for mounting an aftermarket magnetometer, said system comprising:
  a test magnetometer adapted to be mounted at the particular location at the mobile craft, said test magnetometer including at least one output indicating magnetic measurements made by said test magnetometer;
  a computer in communication with said test magnetometer, said computer programmed to display a heading based upon said magnetic measurements made by said test magnetometer, said computer further programmed to monitor changes in said heading while at least one powered component of said mobile craft is operated to determine that said output has changed by more than a specified amount; and an indicator that is adapted to provide a human-perceptible indication if said heading changes by more than a specified amount while said powered component is operated, said indicator comprising at least one chosen from a visual display that and an audio indicator.

20. The system of claim 19 wherein said computer is programmed to receive said specified amount from an operator.

21. The system of claim 19 further including a magnetometer attitude transmitter that communicates with said computer prior to said magnetometer being mounted in said particular location, said magnetometer attitude transmitter communicating roll and pitch information to said computer.

22. The method of claim 1 including using the aftermarket magnetometer as said test magnetometer.

23. The method of claim 10 including using the aftermarket magnetometer as said test magnetometer.

\* \* \* \* \*